United States Patent
Konagai

(10) Patent No.: US 9,917,101 B1
(45) Date of Patent: Mar. 13, 2018

(54) SEMICONDUCTOR MEMORY DEVICE

(71) Applicant: Toshiba Memory Corporation, Minato-ku (JP)

(72) Inventor: Satoshi Konagai, Kasugai (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/463,612

(22) Filed: Mar. 20, 2017

Related U.S. Application Data

(60) Provisional application No. 62/393,150, filed on Sep. 12, 2016.

(51) Int. Cl.
| H01L 27/115 | (2017.01) |
| H01L 27/11582 | (2017.01) |
| H01L 27/11575 | (2017.01) |
| H01L 21/28 | (2006.01) |
| H01L 27/11565 | (2017.01) |

(52) U.S. Cl.
CPC .. *H01L 27/11582* (2013.01); *H01L 21/28282* (2013.01); *H01L 27/11565* (2013.01); *H01L 27/11575* (2013.01)

(58) Field of Classification Search
CPC ............ H01L 27/11582; H01L 27/11575
USPC ............................................. 257/331
See application file for complete search history.

(56) References Cited

U.S. PATENT DOCUMENTS

| 2007/0252201 A1 | 11/2007 | Kito et al. | |
| 2010/0072538 A1* | 3/2010 | Kito | H01L 27/11578 257/326 |
| 2011/0115010 A1* | 5/2011 | Shim | H01L 27/11565 257/314 |
| 2012/0003831 A1* | 1/2012 | Kang | H01L 27/11551 438/639 |
| 2012/0181602 A1* | 7/2012 | Fukuzumi | H01L 27/0688 257/326 |
| 2013/0062683 A1* | 3/2013 | Fukuzumi | H01L 29/66833 257/324 |
| 2015/0221667 A1 | 8/2015 | Fukuzumi et al. | |
| 2016/0351582 A1* | 12/2016 | Kim | H01L 27/1157 |
| 2017/0012052 A1* | 1/2017 | Jang | H01L 27/11582 |
| 2017/0033044 A1* | 2/2017 | Choi | H01L 23/485 |
| 2017/0117288 A1* | 4/2017 | Maegawa | H01L 27/11556 |
| 2017/0117290 A1* | 4/2017 | Lee | H01L 27/11582 |

FOREIGN PATENT DOCUMENTS

JP  2015-149413  8/2015

* cited by examiner

*Primary Examiner* — George Fourson, III
(74) *Attorney, Agent, or Firm* — Oblon, McClelland, Maier & Neustadt, L.L.P.

(57) ABSTRACT

According to one embodiment, a semiconductor memory device includes a substrate, a stacked body, a columnar member, and an insulating film. The stacked body is provided on the substrate, and includes a plurality of electrode layers separately stacked each other. The columnar member is provided in the stacked body, and includes a first semiconductor portion extending in a stacked direction of the plurality of electrode layers. The insulating film covers a bottom portion of the columnar member.

20 Claims, 17 Drawing Sheets

SEMICONDUCTOR MEMORY DEVICE

CROSS-REFERENCE TO RELATED APPLICATIONS

This application is based upon and claims the benefit of priority from U.S. Provisional Patent Application 62/393,150 filed on Sep. 12, 2016; the entire contents of which are incorporated herein by reference.

FIELD

Embodiments described herein relate generally to a semiconductor memory device.

BACKGROUND

A three-dimensional structure memory device is proposed in which memory holes are formed in a stacked body of a plurality of electrode layers, and in which a charge storage film and a channel extending in the stacked direction of the stacked body are provided in the memory holes. The electrode layers are formed by filling metal or other material in cavities formed by removing a part of the stacked body. A columnar support is provided in the stacked body to reduce deformation of the electrode layers caused by warping of the stacked body due to the cavities. Shorting via the support is of concern.

DETAILED DESCRIPTION

Figure 1:
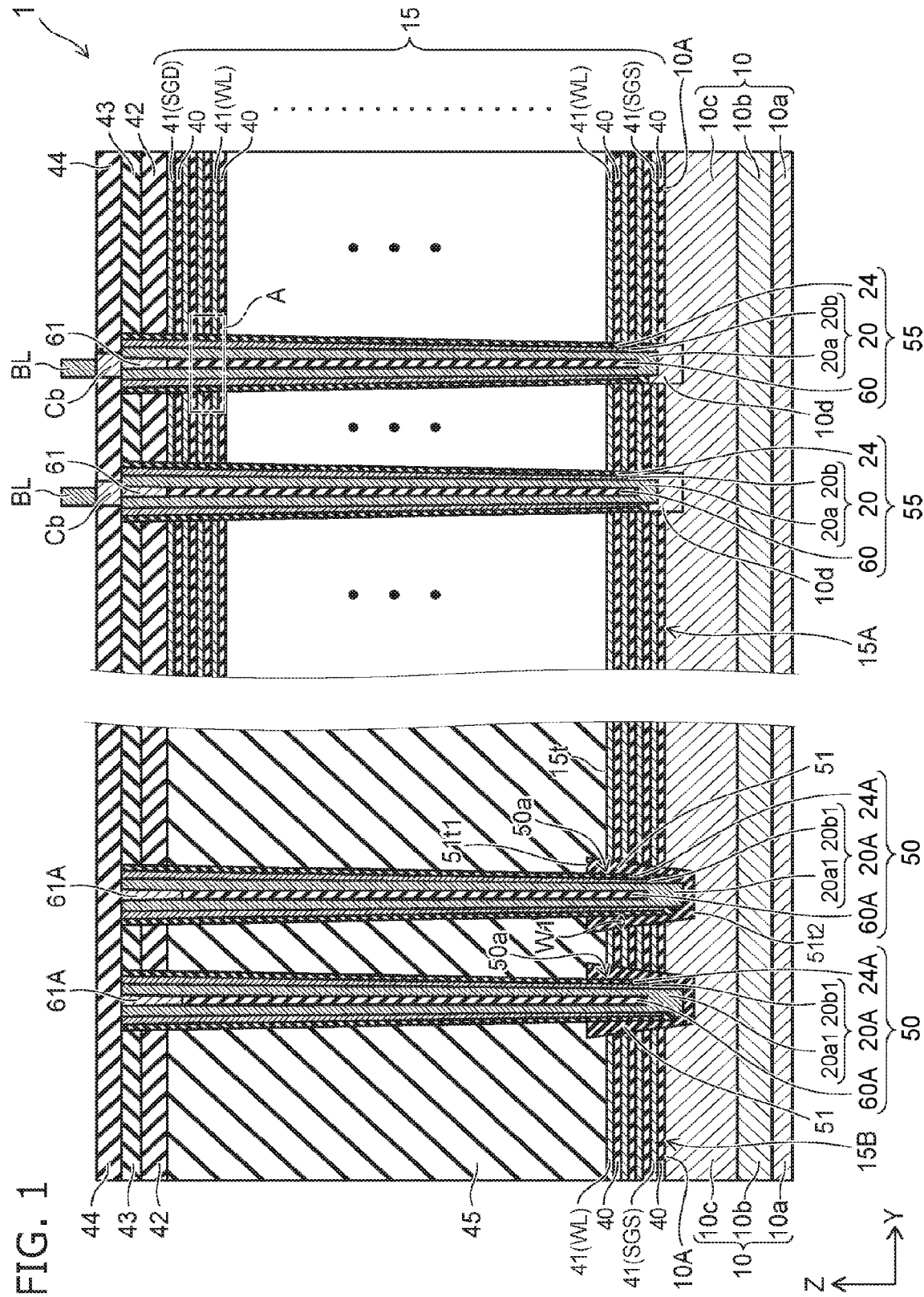
FIG. 1 is a cross sectional view showing a semiconductor memory device according to an embodiment.

According to one embodiment, a semiconductor memory device includes a substrate, a stacked body, a columnar member, and an insulating film. The stacked body is provided on the substrate, and includes a plurality of electrode layers separately stacked each other. The columnar member is provided in the stacked body, and includes a first semiconductor portion extending in a stacked direction of the plurality of electrode layers. The insulating film covers a bottom portion of the columnar member.

Hereinafter, embodiments will be described with reference to the drawings. Incidentally, in the respective drawings, the same elements are denoted by the same reference numerals.

Embodiment

FIG. 1 is a cross sectional view showing a semiconductor memory device according to an embodiment.

Figure 2:
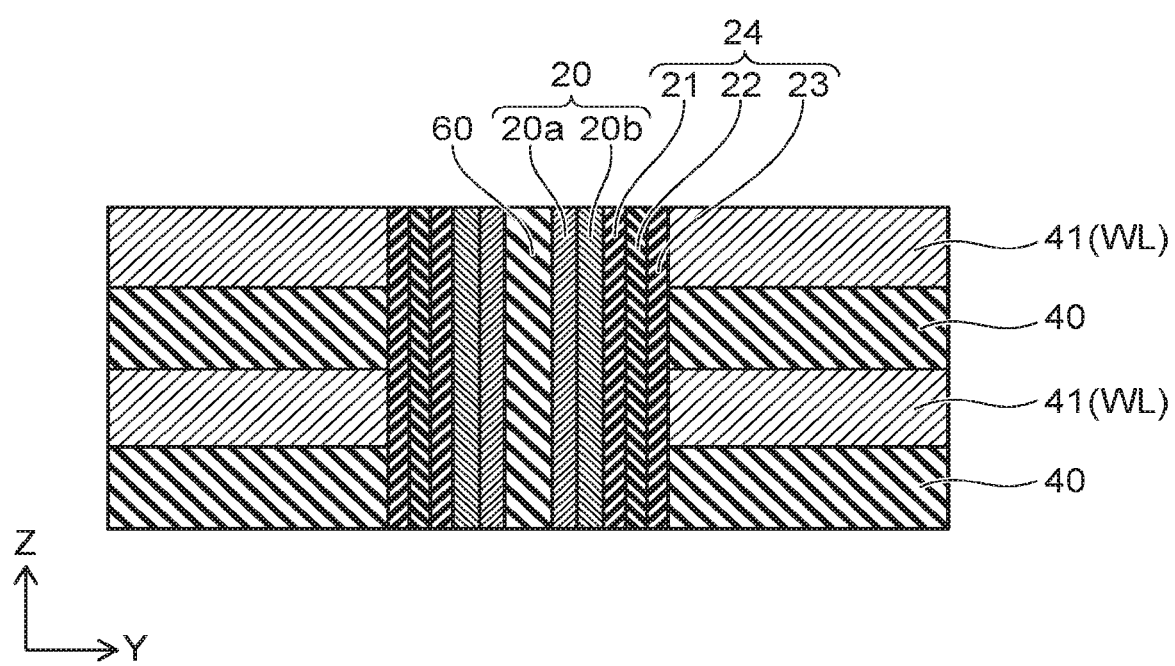
FIG. 2 is an enlarged view of region A of FIG. 1.

FIG. 2 is an enlarged view of region A of FIG. 1.

As shown in FIG. 1, a semiconductor memory device 1 includes a stacked body 15, columnar members 55, and columnar members 50.

The stacked body 15 is provided on a semiconductor substrate 10. The semiconductor substrate 10 contains, for example, silicon (Si). The semiconductor substrate 10 includes a P-type substrate 10a, an N-well region 10b, and a P-well region 10c. The N-well region 10b is formed on the P-type substrate 10a. The P-well region 10c is formed on the N-well region 10b.

In the specification, two directions that are parallel to the upper surface 10A of the semiconductor substrate 10, and that are orthogonal to each other will be referred to as X-direction and Y-direction. A direction orthogonal to both X-direction and Y-direction is Z-direction.

The stacked body 15 has a plurality of electrode layers 41, and a plurality of insulating layers 40. The lowermost electrode layer 41 in the plurality of electrode layers 41 is a source-side select gate SGS, and is provided on the semiconductor substrate 10 via the insulating layer 40. The uppermost electrode layer 41 in the plurality of electrode layers 41 is a drain-side select gate SGD. The electrode layers 41 provided between the lowermost electrode layer 41 (source-side select gate SGS) and the uppermost electrode layer 41 (drain-side select gate SGD) in the plurality of electrode layers 41 are word lines WL. The electrode layers 41 contain, for example, metals such as tungsten (W). The electrode layers 41 may be stacked in any number.

The insulating layers 40 are provided between the electrode layers 41. The insulating layers 40 contain, for example, silicon oxide (SiO).

The stacked body 15 has a central portion 15A, and an end portion 15B. The columnar members 55 are provided in the central portion 15A. The columnar members 50 are provided in the end portion 15B. The end portion 15B has a stepped shape with a step provided for each electrode layer 41 (see FIG. 3). The central portion 15A and the end portion 15B are disposed along Y-direction.

Insulating layers 42, 43, and 44 are provided on the central portion 15A of the stacked body 15, in order. The insulating layers 42, 43, and 44 contain, for example, silicon oxide.

An insulating layer 45 is provided on the end portion 15B of the stacked body 15, covering the end portion 15B. The insulating layer 45 contains, for example, silicon oxide. The insulating layers 42, 43, and 44 are provided on the insulating layer 45, in order.

The columnar members 55 are provided in the central portion 15A of the stacked body 15. The columnar members 55 extend in Z-direction in the central portion 15A. The columnar members 55 have a form of, for example, a circular cylinder, or an elliptic cylinder.

The columnar members 55 have a core portion 60, a channel 20, and a memory film 24.

The core portion 60 contains, for example, silicon oxide. The core portion 60 has, for example, a circular cylinder shape.

A plug portion 61 is provided at the upper end of the core portion 60. The plug portion 61 is in the insulating layers 42 and 43, and surrounded by the channel 20. The plug portion contains, for example, a polysilicon crystallized from amorphous silicon.

The channel 20 is provided around the core portion 60. The channel 20 is a semiconductor portion, and includes a body 20a, and a cover layer 20b. The body 20a has a shape of, for example, a bottomed cylinder. The cover layer 20b is provided around the body 20a. The cover layer 20b has, for example, a cylindrical shape.

The body 20a and the cover layer 20b contain a polysilicon crystallized from silicon, for example, amorphous silicon.

The lower end of the channel 20 is in contact with the semiconductor substrate 10. For example, as shown in FIG.

1, the body 20a of the channel 20 is in contact with a connecting member 10d formed in the semiconductor substrate 10. The connecting member 10d is a member formed inside the semiconductor substrate 10, and into the central portion 15A of the stacked body 15, and is formed by, for example, epitaxial growth of silicon. For example, the upper portion of the connecting member 10d is located in the stacked body 15, whereas the lower portion is in the P-well region 10c of the semiconductor substrate 10.

The memory film 24 is provided around the channel 20. As shown in FIG. 2, the memory film 24 includes a tunnel insulating film 21, a charge storage film 22, and a block insulating film 23. The tunnel insulating film 21 is provided around the channel 20. The tunnel insulating film 21 contains, for example, silicon oxide. The tunnel insulating film 21 has, for example, a cylindrical shape.

The charge storage film 22 is provided around the tunnel insulating film 21. The charge storage film 22 contains, for example, silicon nitride (SiN). The charge storage film 22 has, for example, a cylindrical shape. A memory cell including the charge storage film 22 is formed at the intersections of the channels 20 and the word lines WL.

The tunnel insulating film 21 is a potential barrier between the charge storage film 22 and the channel 20. The tunnel insulating film 21 is where the charge tunnels through when moving from the channel 20 to the charge storage film 22 (write operation), and from the charge storage film 22 to the channel 20 (erase operation).

The charge storage film 22 has trapping sites for trapping charge. The threshold value of the memory cell varies with the presence or absence of a trapped charge at the trapping sites, and the amount of trapped charge. The memory cell retains information in this fashion.

The block insulating film 23 is provided around the charge storage film 22. The block insulating film 23 contains, for example, silicon oxide. The block insulating film 23 protects, for example, the charge storage film 22 from etching when forming the electrode layers 41. The block insulating film 23 may be a laminate of a silicon oxide film, and an aluminum oxide film.

Above the columnar members 55 is provided a plurality of bit lines BL that extends in X-direction. The bit lines BL are connected to the columnar members 55 via the contact portions Cb. The contact portions Cb are disposed in the insulating layer 44, with the upper end connected to the bit lines BL, and the lower end connected to the plug portions 61. The contact portions Cb are formed of a conductor such as a metal.

The columnar members 50 are provided in the end portion 15B of the stacked body 15. The columnar members 50 extend in Z-direction in the end portion 15B. The columnar members 50 include at least some of the elements of the columnar members 55.

In the case where the columnar members 50 have all of the elements of the columnar members 55, the columnar members 50 include a core portion 60A, a channel 20A, and a memory film 24A, as shown in FIG. 1. The core portion 60A of the columnar members 50 contains the same material, for example, silicon oxide, contained in the core portion 60 of the columnar members 55. The channel 20A of the columnar members 50 is a semiconductor portion, and has a body 20a1, and a cover layer 20b1. The channel 20A contains the same material, for example, polysilicon, contained in the channel 20 of the columnar members 55. As with the case of the memory film 24 of the columnar members 55, the memory film 24A of the columnar members 50 is formed as a laminated film, and contains the same material contained in the memory film 24.

A plug portion 61A is provided at the upper end of the core portion 60A of the columnar members 50.

An insulating film 51 is provided in the end portion 15B of the stacked body 15. The insulating film 51 covers the bottom portion 50a of the columnar members 50. The bottom portion 50a is a portion of the columnar members 50 located in the semiconductor substrate 10 and in the end portion 15B of the stacked body 15.

The insulating film 51 contains, for example, silicon oxide (SiO). The insulating film 51 has a shape of, for example, a bottomed cylinder.

The upper end 51t1 of the insulating film 51 is in contact with the insulating layer 45, and is higher than, for example, the upper end 15t of the stacked body 15. The upper end 15t of the stacked body 15 is at the same level as the step 41s of the electrode layer 41 (see FIG. 3). The upper end 51t1 of the insulating film 51 may be at substantially the same level as the upper end 15t of the stacked body 15.

The lower end 51t2 of the insulating film 51 is in contact with the semiconductor substrate 10. For example, the lower end 51t2 is in contact with the semiconductor substrate 10, inside the P-well region 10c.

For example, the insulating film 51 becomes thinner toward the lower layers of the stacked body 15. For example, the thickness W1 of the insulating film 51 between the stacked body 15 and the memory film 24A becomes smaller toward the lower layers of the stacked body 15. The thickness W1 of the insulating film 51 may be substantially the same along Z-direction.

Figure 3:
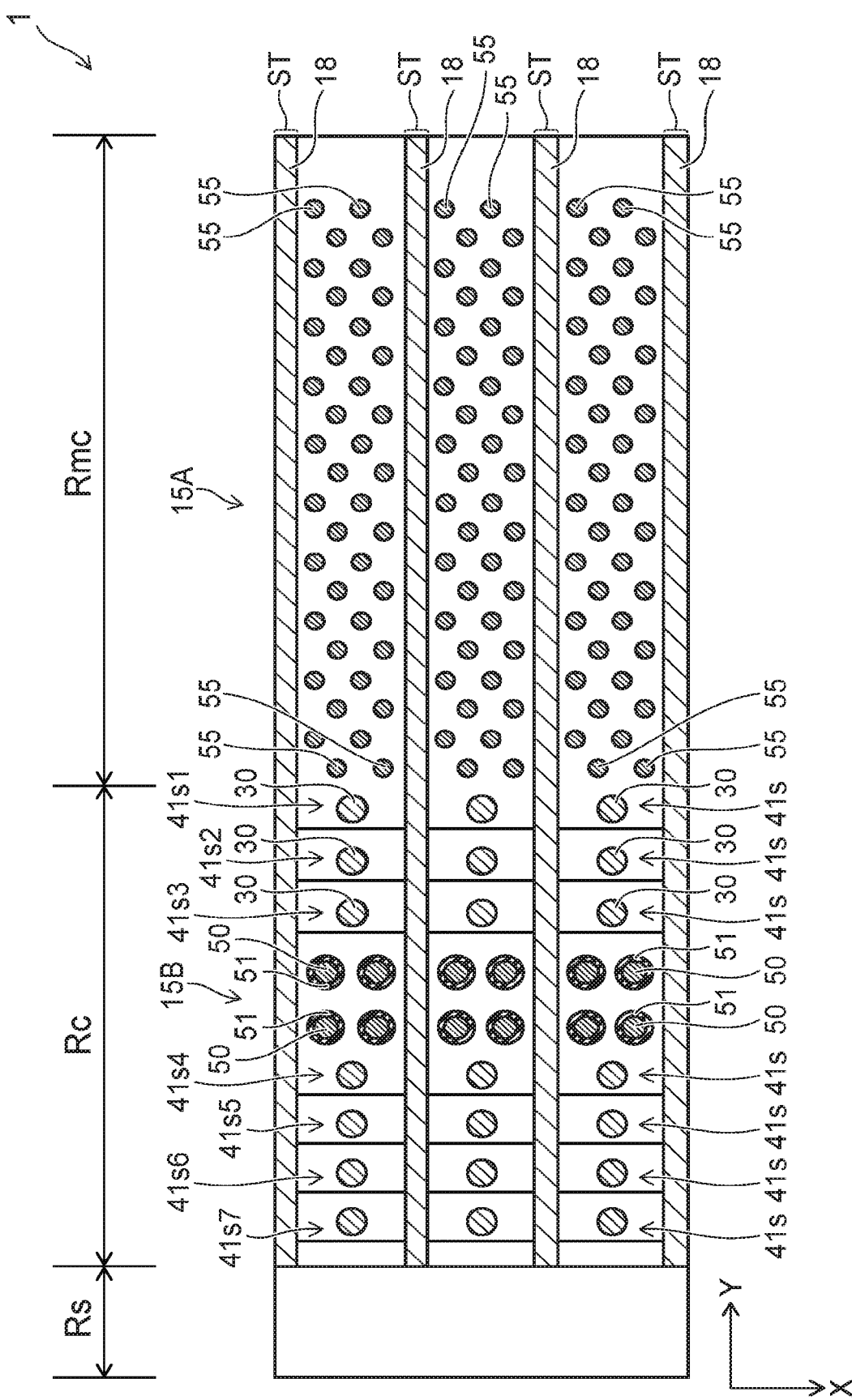
FIG. 3 is a plan view showing the semiconductor memory device according to the embodiment.

FIG. 3 is a plan view showing the semiconductor memory device according to the embodiment.

The bit lines BL are omitted in FIG. 3.

As shown in FIG. 3, the semiconductor memory device 1 has a memory cell region Rmc, a contact region Rc, and a skirt region Rs. The memory cell region Rmc, the contact region Rc, and the skirt region Rs are disposed along Y-direction.

The memory cell region Rmc includes the central portion 15A of the stacked body 15, and the columnar members 55 are disposed in the memory cell region Rmc. The columnar members 55 are disposed, for example, in a matrix on X-Y plane.

A plurality of slits ST is formed in the memory cell region Rmc and the contact region Rc. The slits ST are formed in the stacked body 15. The slits ST extend in Z-direction and Y-direction in the stacked body 15. The slits ST separate the stacked body 15 in X-direction. Each region separated by the slits ST is called "block". A selected columnar member 55 from each block is electrically connected to one of the bit lines BL.

An interconnect portion 18 is provided in the slits ST. The interconnect portion 18 extends in Z-direction and Y-direction. The interconnect portion 18 contains, for example, a metal such as tungsten. The upper end of the interconnect portion 18 is connected via a contact to a source line (not shown) provided on the stacked body 15. The lower end of the interconnect portion 18 is in contact with the semiconductor substrate 10.

Inside the slits ST, an insulating film (not shown) is provided on side walls of the interconnect portion 18. The insulating film insulates the interconnect portion 18 from the electrode layers 41 of the stacked body 15.

The contact region Rc includes the end portion 15B of the stacked body 15, and the columnar members 50 are disposed in the contact region Rc. The end portion 15B has a stepped shape with a step provided for each electrode layer 41. The step 41s is formed for each electrode layer 41.

A contact 30 is provided on each step 41s. The contact 30 extends in Z-direction. The upper end of the contact 30 is connected to an upper-layer word line (not shown). The lower end of the contact 30 is connected to the electrode layer 41. Each electrode layer 41 is connected to a single upper-layer word line via the contact 30.

The columnar members 50 extend in Z-direction through the step 41s. In the example shown in FIG. 3, the stacked body 15 has a total of seven electrode layers 41, and steps 41s1 to 41s7 are formed at the end portion 15B of the stacked body 15. The step 41s1 is formed for the uppermost electrode layer 41 (drain-side select gate SGD), and the step 41s7 is formed for the lowermost electrode layer 41 (source-side select gate SGS). The columnar members 50 extend in Z-direction through the step 41s4.

As shown in FIG. 1, the columnar members 50 extend in Z-direction in the end portion 15B of the stacked body 15, and in the insulating layer 45. At the end portion 15B, the insulating film 51 covers the side and bottom surfaces of the columnar members 50.

A plurality of transistors Tr (see FIG. 4 to FIG. 11) is provided as switching elements in the skirt region Rs. The transistors Tr are disposed on the semiconductor substrate 10 according to a known method. The transistors Tr constitute a peripheral circuit, and, for example, a part of the transistors Tr is connected to the electrode layers 41 via the contact 30 and the upper-layer word line.

In the memory cell region Rmc, the memory cell including the charge storage film 22 is formed at the intersections of the channels 20 and the word lines WL. The plurality of memory cells is arranged in a three-dimensional matrix along X-, Y-, and Z-directions. The memory cells are adapted so that data are stored in each memory cell, using the word line WL as a gate electrode. In the contact region Rc and the skirt region Rs, the electrode layers 41 are connected to the peripheral circuit via, for example, the contacts 30 by being led out.

FIG. 4 to FIG. 17 are cross sectional views showing a method for manufacturing the semiconductor memory device according to the embodiment.

FIG. 4 to FIG. 11 are magnified Y-Z cross sectional views showing a manufacturing process of the contact region Rc and the skirt region Rs of the semiconductor memory device 1 shown in FIG. 3. FIG. 12 to FIG. 17 are magnified Y-Z cross sectional views showing a manufacturing process of the memory cell region Rmc and the contact region Rc of the semiconductor memory device 1 shown in FIG. 3.

The manufacturing process of the contact region Rc and the skirt region Rs is described first with reference to FIG. 4 to FIG. 11.

Figure 4:
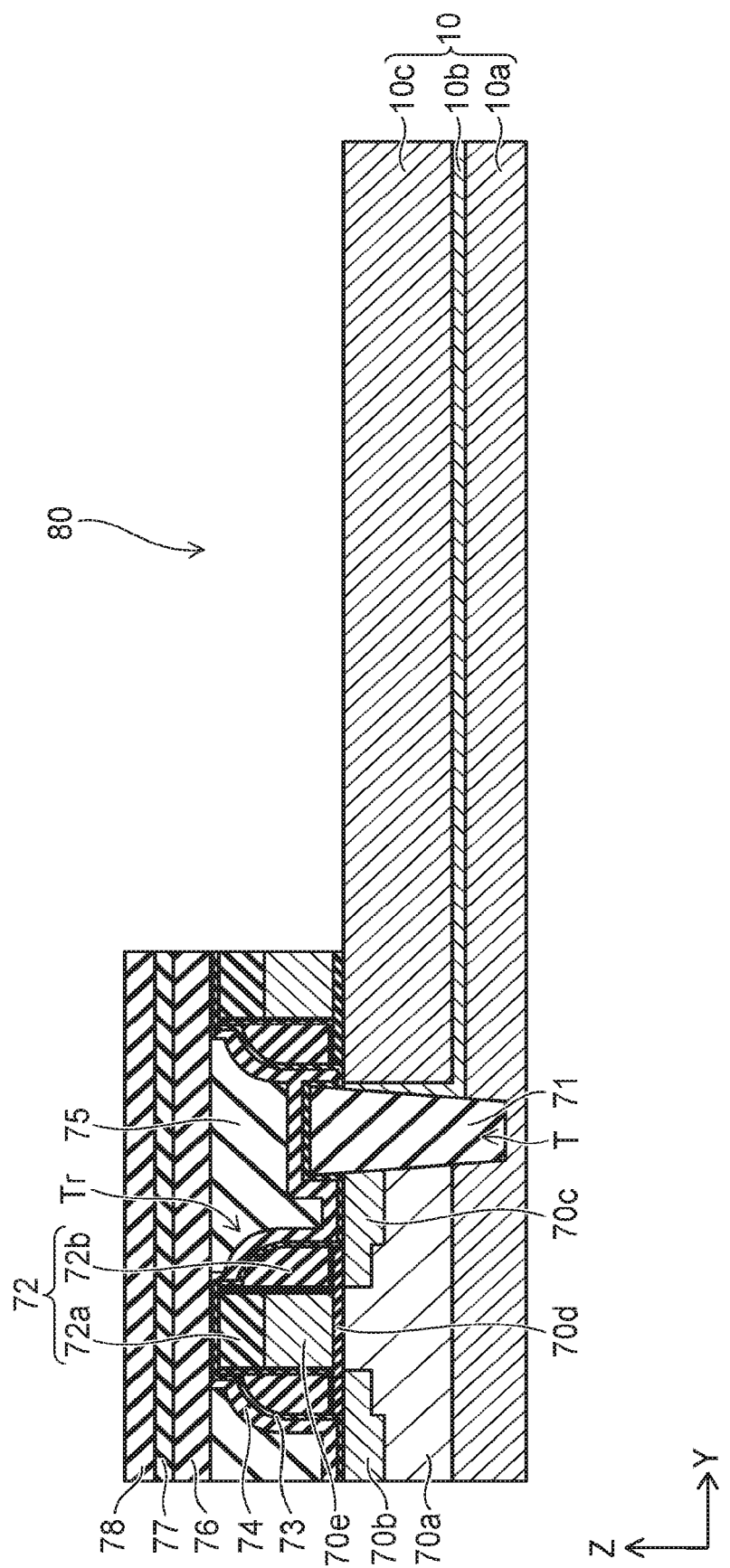
FIG. 4 to FIG. 17 are cross sectional views showing a method for manufacturing the semiconductor memory device according to the embodiment.

As shown in FIG. 4, an intermediate structure is formed by using a known method. In the intermediate structure shown in FIG. 4, a channel region 70a, a source region 70b, and a drain region 70c are provided on the P-type substrate 10a. The source region 70b and the drain region 70c are mutually distal to each other, and the channel region 70a is between the source region 70b and the drain region 70c.

A gate insulating film 70d is provided on the channel region 70a, and a gate electrode 70e is provided on the gate insulating film 70d. For example, the gate electrode 70e is a stacked body of a polysilicon-containing layer and a tungsten-containing layer.

The transistor Tr is configured from the channel region 70a, the source region 70b, the drain region 70c, the gate insulating film 70d, and the gate electrode 70e. The peripheral circuit is configured by disposing a plurality of transistors Tr.

In the intermediate structure, the N-well region 10b and the P-well region 10c are provided on the P-type substrate 10a, in order. An STI 71 is provided in a trench T extending in X-, Z-directions. The STI 71 divides the channel region 70a, the source region 70b, and the drain region 70c from the N-well region 10b and the P-well region 10c. The semiconductor substrate 10 including the substrate 10a, the N-well region 10b, and the P-well region 10c is configured as a result. A recessed portion 80 is formed on the P-well region 10c of the semiconductor substrate 10.

In the intermediate structure, insulating films 72a and 72b are provided on the upper surface and the side surface, respectively, of the gate electrode 70e. For example, the insulating film 72a contains silicon nitride, and the insulating film 72b contains silicon oxide. The insulating films 72a and 72b represent a protective film 72 for the transistor Tr.

Insulating films 73 and 74, and an insulating layer 75 are provided on the protective film 72, in order. For example, the insulating film 73 and the insulating layer 75 contain silicon oxide, and the insulating film 74 contains silicon nitride. The insulating films 73 and 74 cover the transistor Tr. Insulating layers 76, 77, and 78 are provided on the insulating film 74 and the insulating layer 75, in order. For example, the insulating layers 76 and 78 contain silicon nitride, and the insulating layer 77 contains silicon oxide.

Figure 5:
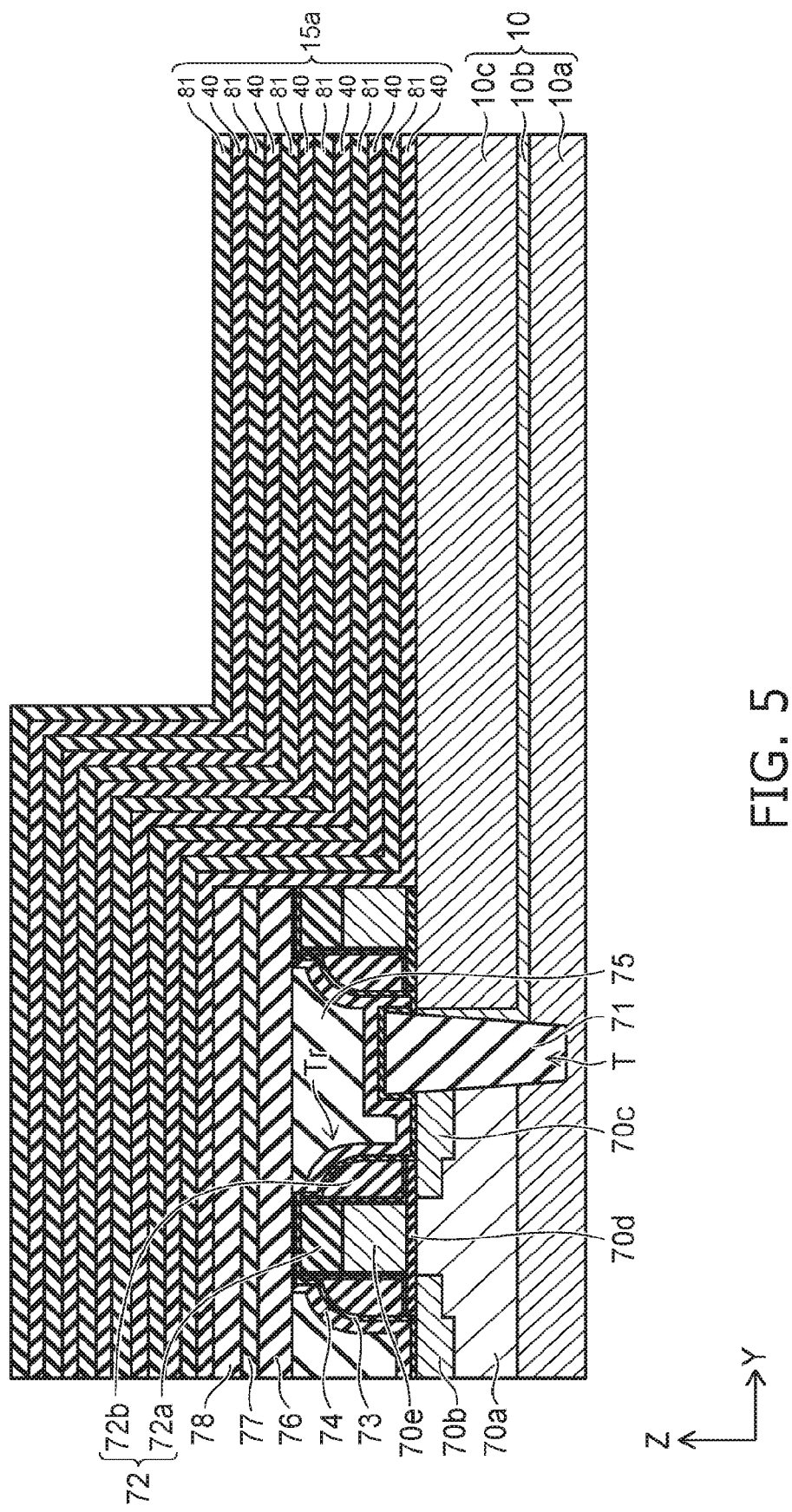

Thereafter, as shown in FIG. 5, the insulating layer 40, and a sacrifice layer 81 are alternately stacked on the semiconductor substrate 10 (P-well region 10c) along Z-direction to form a stacked body 15a, using, for example, CVD (Chemical Vapor Deposition) method. The stacked body 15a covers the semiconductor substrate 10 and the insulating layer 78. The insulating layer 40 is formed of, for example, silicon oxide. The sacrifice layer 81 is formed of a material that can provide an etching selectivity ratio for the insulating layers 40. For example, the sacrifice layer 81 is formed of silicon nitride. In the example shown in FIG. 5, the stacked body 15a has a total of six insulating layers 40, and a total of six sacrifice layers 81. However, the number of these layers is not limited to this example.

Figure 6:
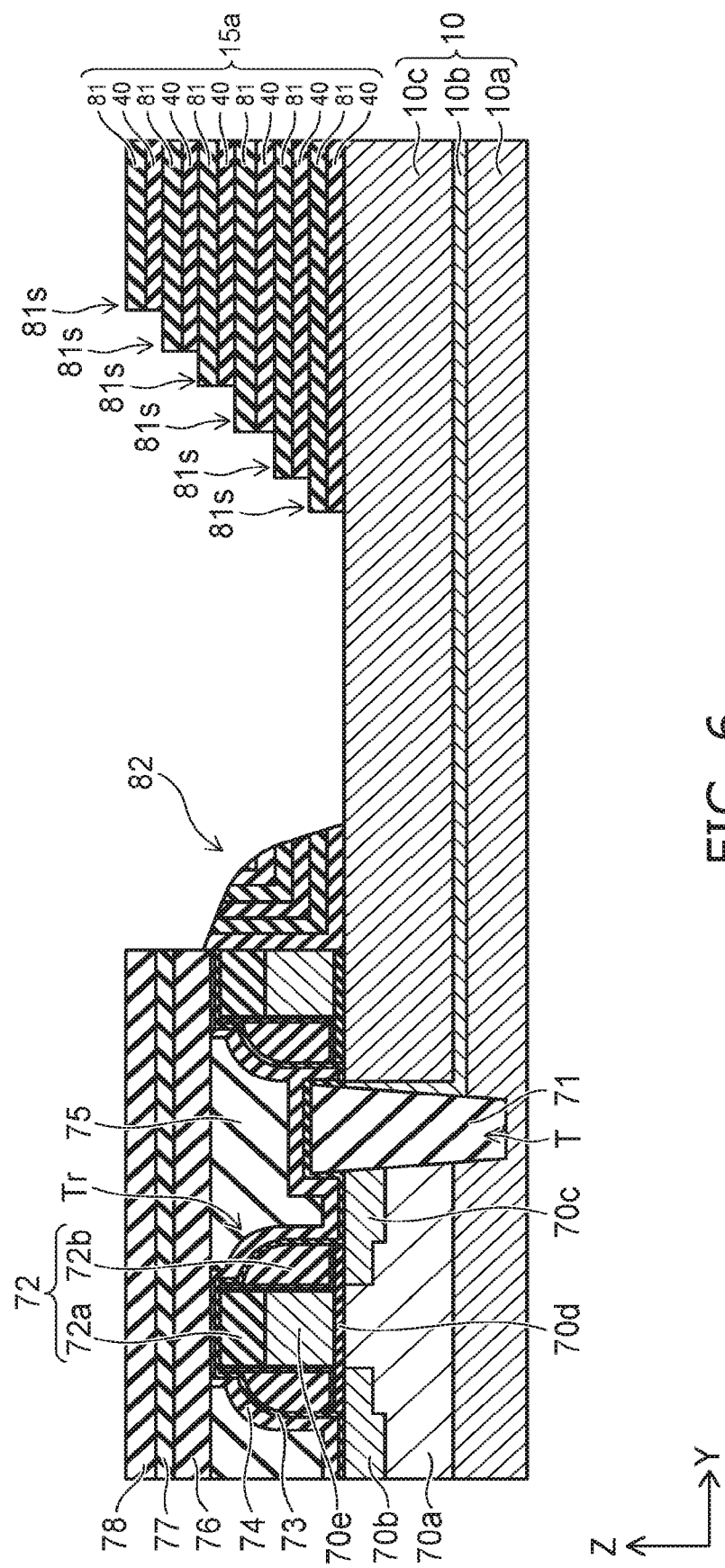

Thereafter, as shown in FIG. 6, the stacked body 15a formed on the semiconductor substrate 10 is processed into a stepped shape. For example, in the case of the example shown in FIG. 3, the stepped portion of the stacked body 15a corresponds to the stepped portion of the stacked body 15 with the steps 41s4 to 41s7. Such a stepped portion is formed using, for example, a photolithography technique that controls the etching amount of the stacked body 15a by repeating a horizontal etching (Y-direction) of the resist on the stacked body 15a, and a downward etching (minus Z-direction) of the stacked body 15a. The etchings remove the stacked body 15a formed on the insulating layer 78, and make a stepped portion in the stacked body 15a formed on the semiconductor substrate 10. A step 81s is formed for each sacrifice layer 81.

In FIG. 6, a stacked body 82 is a portion that remains after the stacked body 15a on the semiconductor substrate 10 is processed into a stepped shape.

Figure 7:
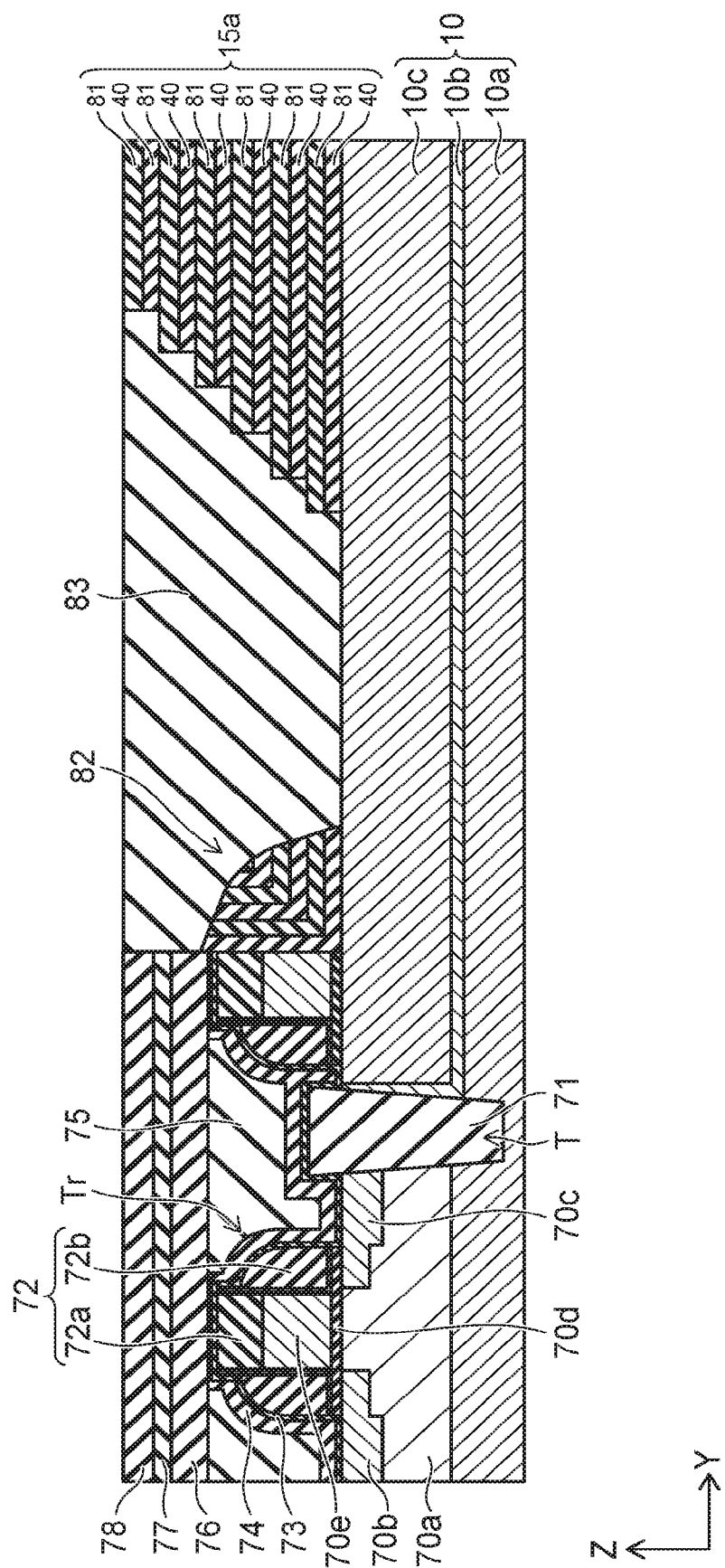

Thereafter, as shown in FIG. 7, an insulating layer 83 is formed by depositing silicon oxide on the semiconductor substrate 10 by, for example, a CVD method. The insulating layer 83 covers the stacked body 15a and the stacked body 82. The upper surface of the insulating layer 83 is then planarized by CMP (Chemical Mechanical Polishing)

method, using, for example, the insulating layer 78 and the uppermost sacrifice layer 81 as stoppers.

Figure 8:
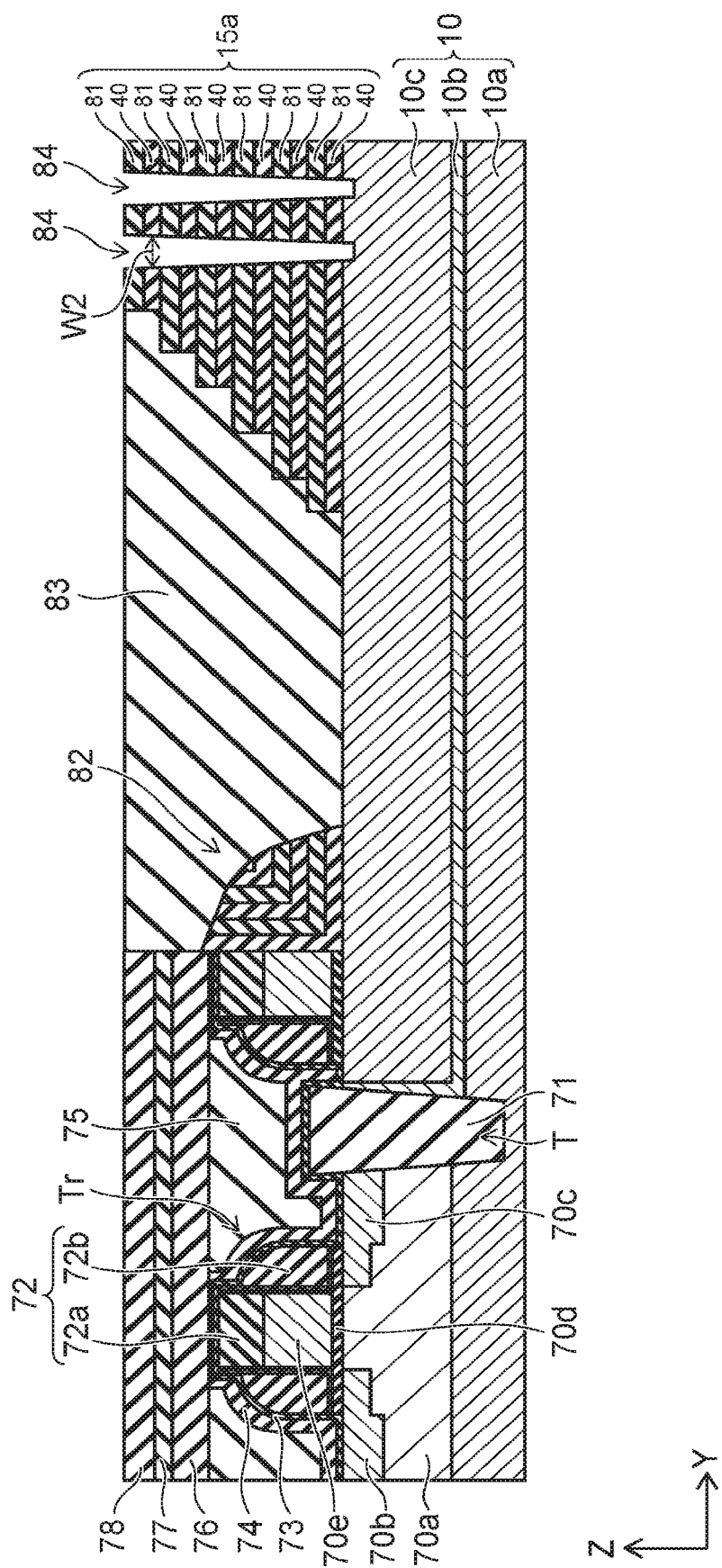

Thereafter, as shown in FIG. 8, a plurality of holes 84 is formed in the stacked body 15a by, for example, RIE (Reactive Ion Etching). The holes 84 extend in Z-direction from the step 81s of the uppermost sacrifice layer 81 (see FIG. 6), and reach the semiconductor substrate 10 through the stacked body 15a. For example, in the case of the example shown in FIG. 3, the step 81s of the uppermost sacrifice layer 81 corresponds in position to the step 41s4. For example, the bottom surface of the holes 84 is in the P-well region 10c of the semiconductor substrate 10. For example, the holes 84 are circular in shape as viewed from Z-direction. For example, the width W2 of the holes 84 in an X-Y cross section becomes smaller toward the lower layers of the stacked body 15a, and is the smallest at the bottom surface of the holes 84.

Figure 9:
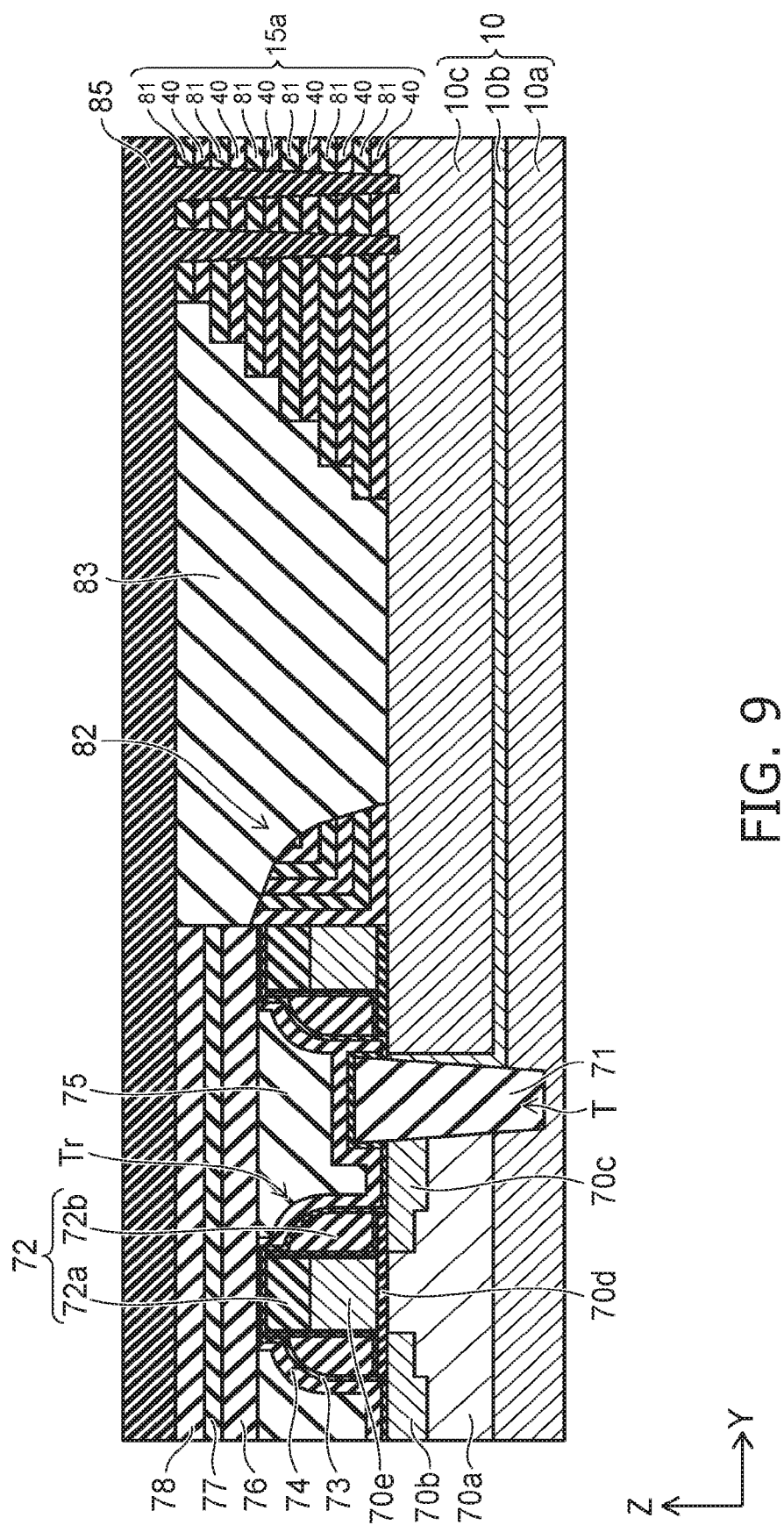

Thereafter, as shown in FIG. 9, an insulating film 85 is formed on the stacked body 15a and the insulating layers 78 and 83, using, for example, a CVD method. The insulating film 85 is formed also inside the holes 84. The insulating film 85 is formed using, for example, silicon oxide.

Figure 10:
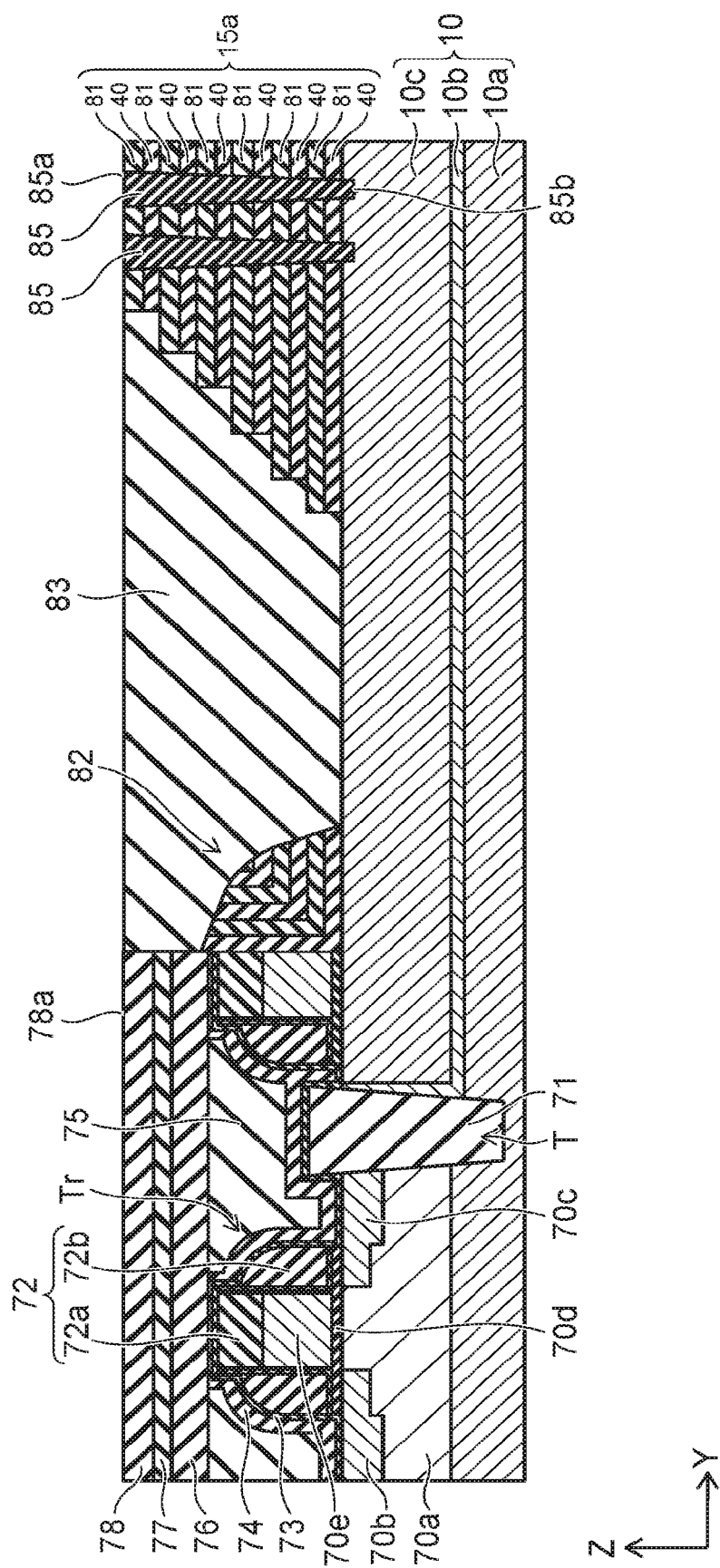

Thereafter, as shown in FIG. 10, the upper surface of the insulating film 85 in the holes 84 is planarized by, for example, CMP method. The planarization process removes the insulating film 85 on the stacked body 15a and on the insulating layers 78 and 83, leaving the insulating film 85 inside the holes 84. The upper surface 85a of the insulating film 85 in the holes 84 is substantially at the same level as, for example, the upper surface 78a of the insulating layer 78. The lower surface 85b of the insulating film 85 in the holes 84 is in contact with the semiconductor substrate 10 (P-well region 10c).

Figure 11:
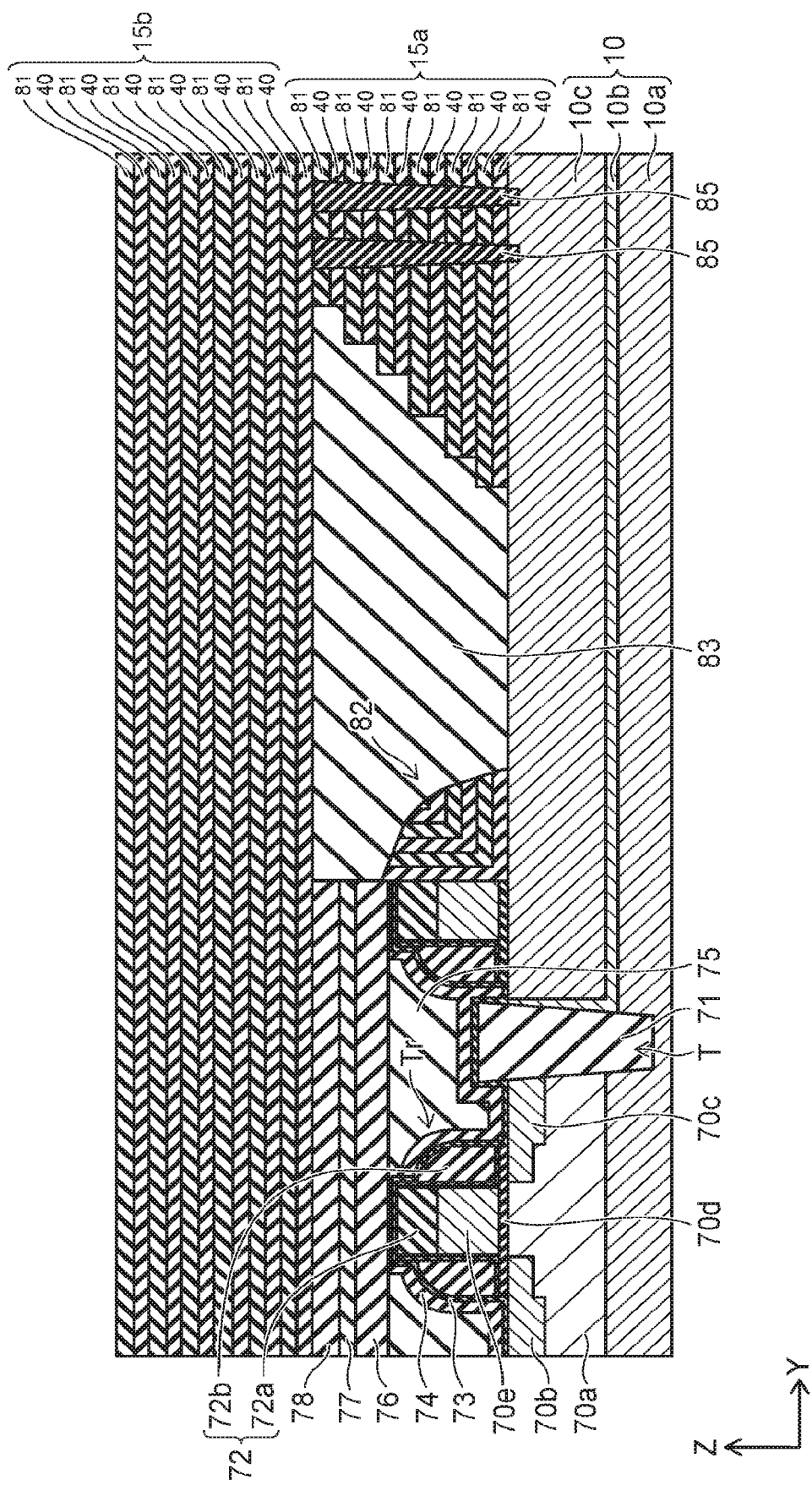

Thereafter, as shown in FIG. 11, the insulating layer 40 and the sacrifice layer 81 are alternately stacked in Z-direction on the stacked body 15a and the insulating layers 78 and 83 to form a stacked body 15b, using, for example, a CVD method. In the example shown in FIG. 11, the stacked body 15b has a total of six insulating layers 40, and a total of six sacrifice layers 81. However, the number of these layers is not limited to this example.

The following describes a manufacturing process of the memory cell region Rmc and the contact region Rc with reference to FIG. 12 to FIG. 17.

Figure 12:
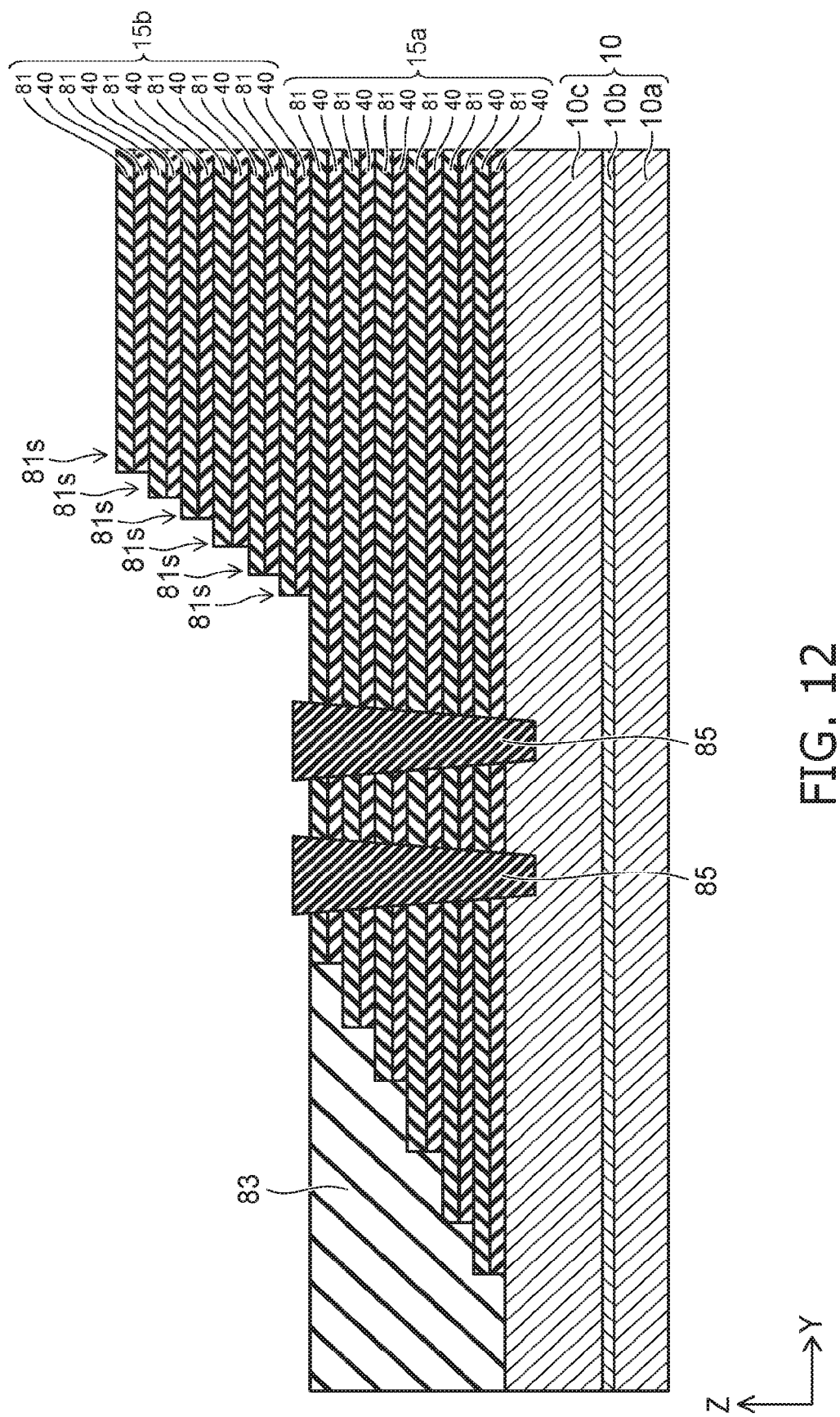

After the process shown in FIG. 11, the stacked body 15b is processed into a stepped shape, as shown in FIG. 12. The stepped portion of the stacked body 15b is formed in Y-direction, continuously from the stepped portion of the stacked body 15a. For example, in the case of the example shown in FIG. 3, the stepped portion of the stacked body 15b corresponds to the stepped portion of the stacked body 15 with the steps 41s1 to 41s3. Such a stepped portion is formed using, for example, a photolithography technique that controls the etching amount of the stacked body 15b by repeating a horizontal etching (Y-direction) of the resist on the stacked body 15b, and a downward etching (minus Z-direction) of the stacked body 15b. The etchings make a stepped portion in the stacked body 15b, and the step 81s is formed for each sacrifice layer 81.

Figure 13:
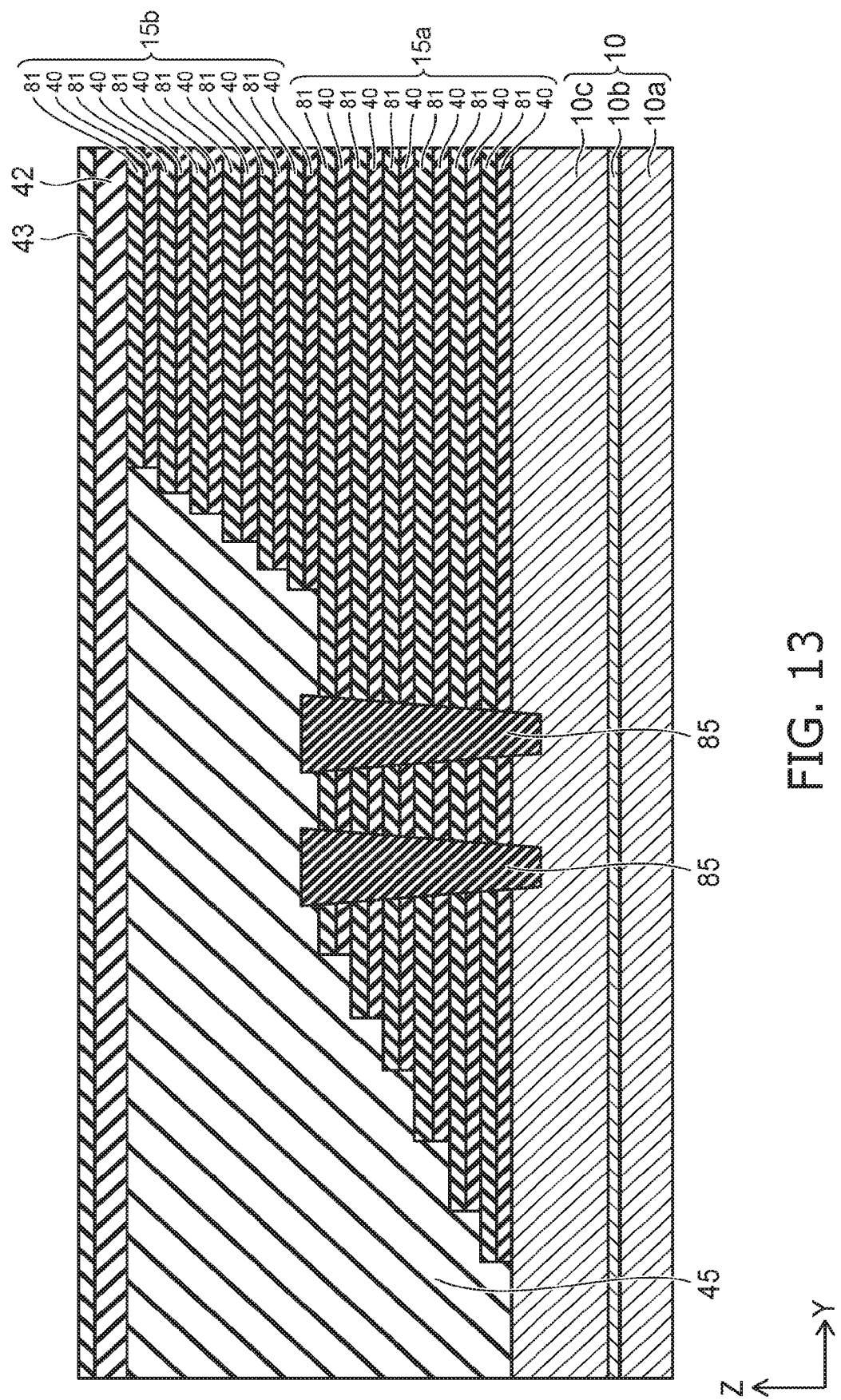

Thereafter, as shown in FIG. 13, silicon oxide is deposited on the insulating layer 83 to form an insulating layer 45, using, for example, a CVD method. The insulating layer 83 is a portion of the insulating layer 45. The insulating layer 45 covers the stacked body 15a, and the stepped portion of the stacked body 15b. Silicon oxide is then deposited on the stacked body 15b and the insulating layer 45 to form the insulating layers 42 and 43, in order.

Figure 14:
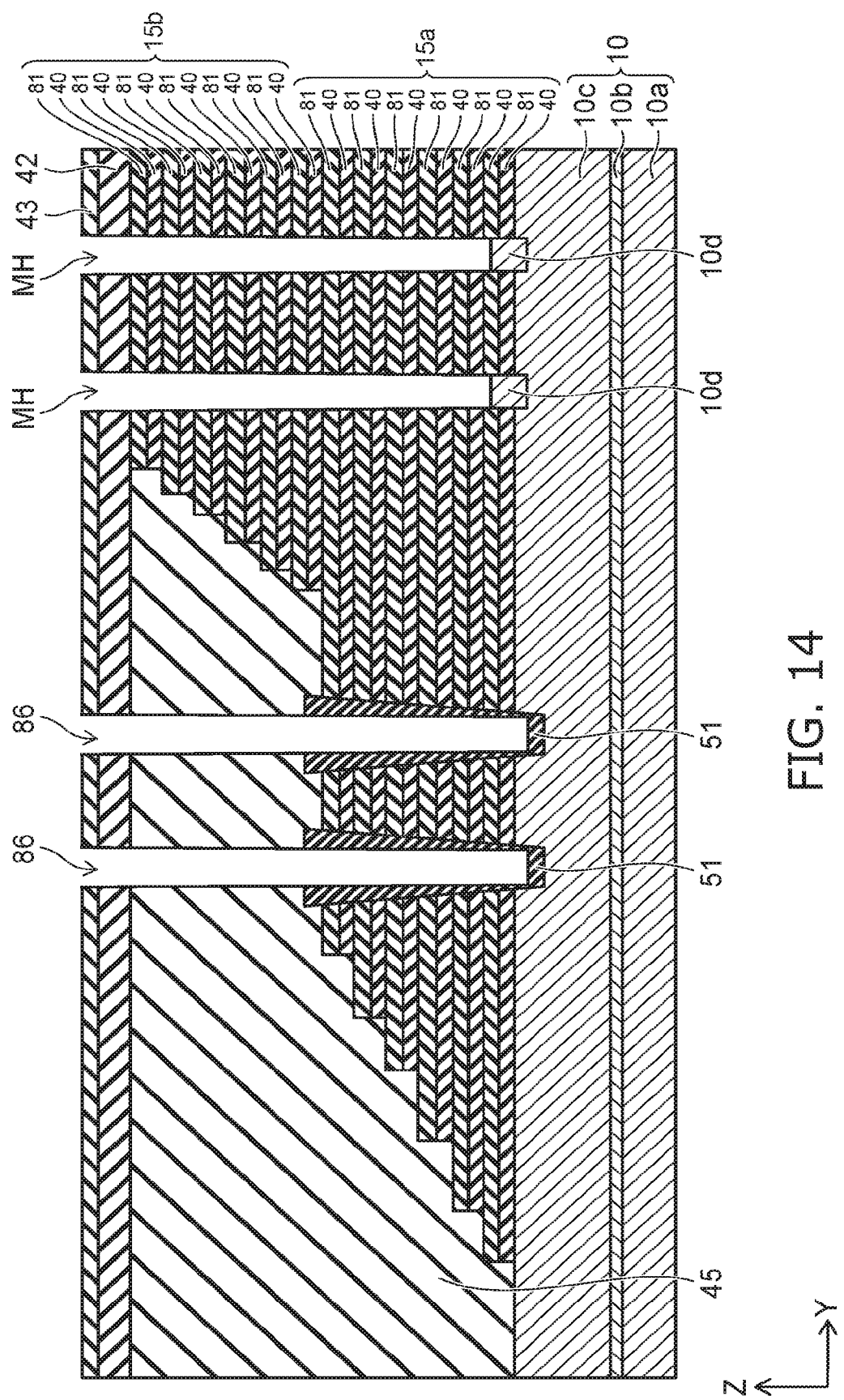

Thereafter, as shown in FIG. 14, a plurality of memory holes MH is formed in the stacked bodies 15a and 15b, and a plurality of holes 86 is formed in the stacked body 15a.

The memory holes MH are formed by, for example, RIE. The memory holes MH extend in Z-direction, and reach the semiconductor substrate 10 through the insulating layers 42 and 43, and the stacked bodies 15a and 15b. For example, the bottom surface of the memory holes MH is in the P-well region 10c of the semiconductor substrate 10. For example, the memory holes MH are circular in shape as viewed from Z-direction.

The holes 86 extend in Z-direction, and reach the semiconductor substrate 10 through the insulating layers 42, 43, and 45, and the stacked body 15a. The holes 86, formed by, for example, a photolithography technique and etching, extend in Z-direction through the insulating layers 42, 43, and 45, and reach the semiconductor substrate 10 through the stacked body 15a by extending into the insulating film 85 from directly above the insulating film 85. In the example shown in FIG. 3, the holes 86 penetrate through the step 41s4. This forms the insulating film 51. For example, the bottom surface of the holes 86 is in the P-well region 10c of the semiconductor substrate 10. For example, the holes 86 are circular in shape as viewed from Z-direction.

After the formation of the memory holes MH, the connecting member 10d is formed by, for example, epitaxial growth of silicon from inside of the semiconductor substrate 10 into the stacked body 15a.

Figure 15:
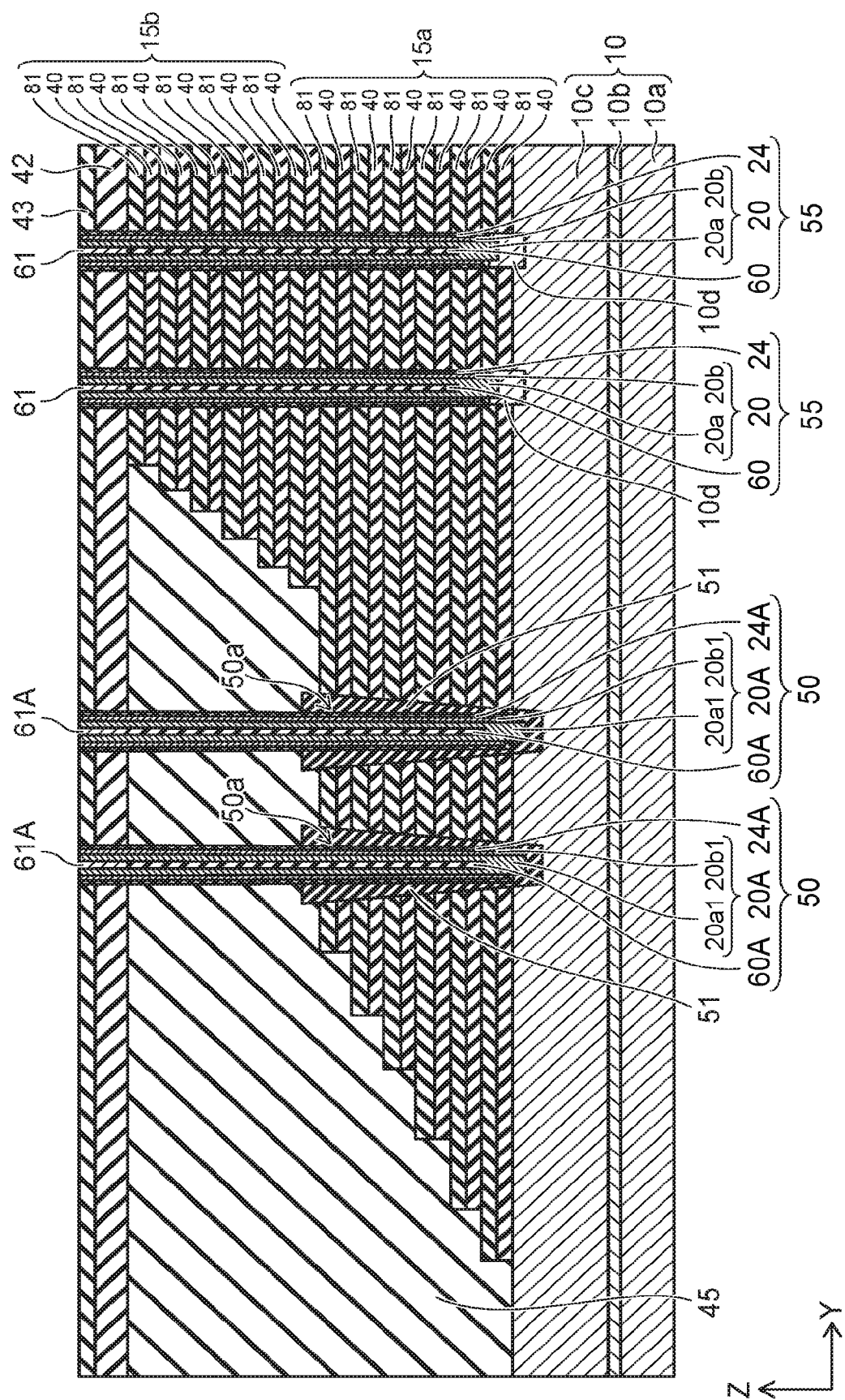

Thereafter, as shown in FIG. 15, silicon oxide is deposited on the inner surface of the memory holes MH to form the block insulating film 23 (see FIG. 2), using, for example, a CVD method. Silicon nitride is deposited to form the charge storage film 22 (see FIG. 2), and silicon oxide is deposited to form the tunnel insulating film 21 (see FIG. 2). Thereafter, silicon is deposited to form the cover layer 20b. This is followed by RIE, which removes the cover layer 20b, the tunnel insulating film 21, the charge storage film 22, and the block insulating film 23, and exposes the connecting member 10d. This forms the memory film 24.

Silicon oxide, silicon nitride, and silicon oxide are deposited in order on the inner surface of the holes 86 to form a multilayer film, and silicon is deposited to form the cover layer 20b1. This is followed by RIE, which removes the cover layer 20b1 and the multilayer film, and exposes the insulating film 51. This forms the memory film 24A.

Thereafter, silicon is deposited in the memory holes MH to form the body 20a, and silicon oxide is deposited to form the core portion 60. This forms the channel 20. The columnar members 55 having the core portion 60, the channel 20, and the memory film 24 are formed after this process. The body 20a of the channel 20 is in contact with the connecting member 10d formed in the semiconductor substrate 10.

Silicon is deposited in the holes 86 to form the body 20a1, and silicon oxide is deposited to form the core portion 60A. This forms the channel 20A. The columnar members 50 having the core portion 60A, the channel 20A, and the memory film 24A are formed after this process. The bottom portion 50a of the columnar members 50 is covered by the insulating film 51.

Thereafter, the upper part of the core portion 60 in the memory holes MH, and the core portion 60A in the holes 86 are removed by being etched back, and impurity-doped silicon is embedded to form the plug portion 61 and the plug portion 61A.

Figure 16:
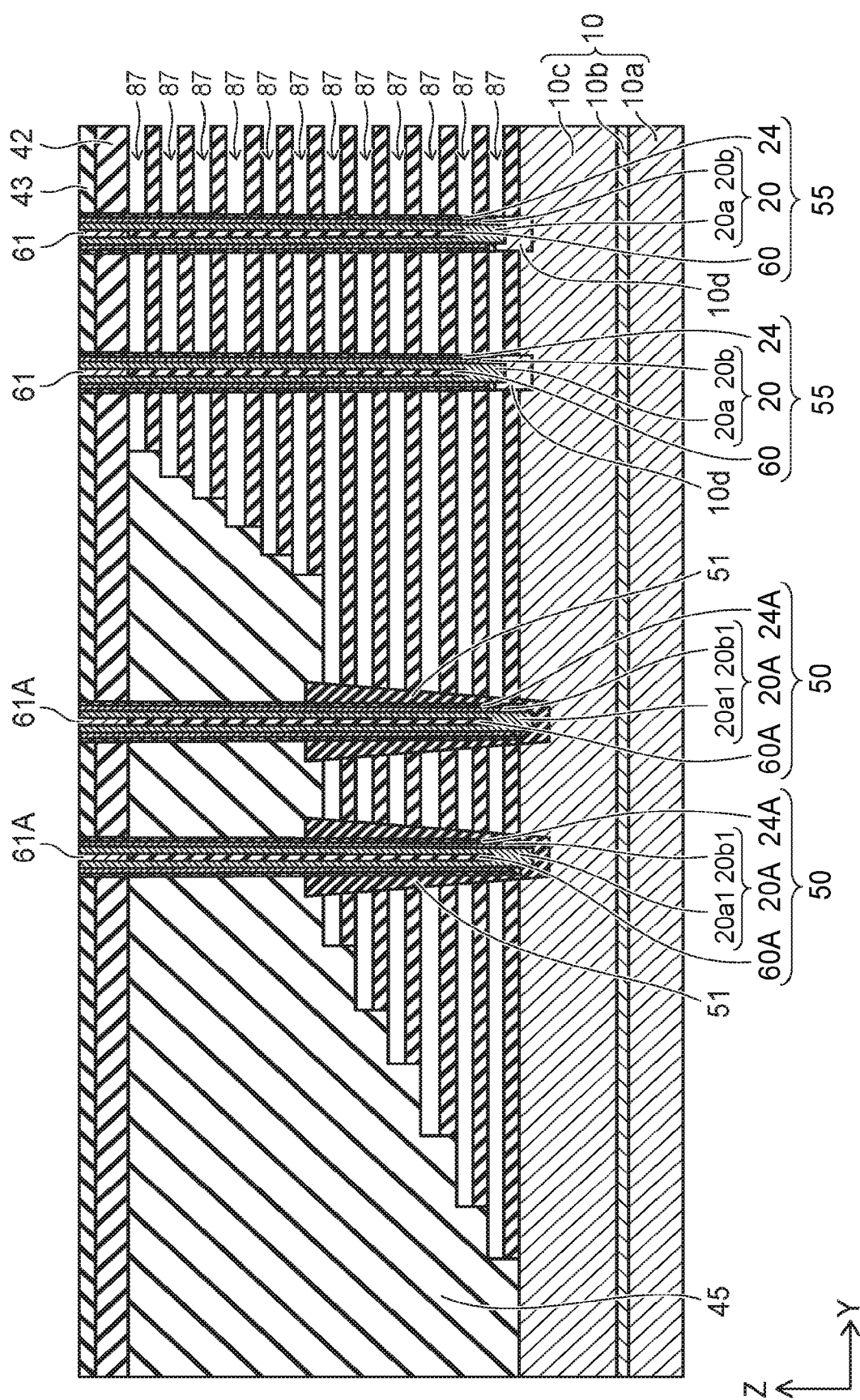

Thereafter, as shown in FIG. 16, the slits ST (see FIG. 3) are formed that extend through the stacked bodies 15a and 15b in Y-direction, using, for example, RIE. The slits ST penetrate through the insulating layers 42 and 43, and the stacked bodies 15a and 15b. In this way, the slits ST divide the stacked bodies 15a and 15b into a plurality of stacked bodies that extends in Y-direction.

This is followed by wet etching via the slits ST. This removes the sacrifice layer 81 (see FIG. 15). When the sacrifice layer 81 is formed using silicon nitride, phosphoric acid is used as an etchant for wet etching, and etching is performed with hot phosphoric acid. The removal of the sacrifice layer 81 via the slits ST forms cavities 87. The columnar members 50 in the stacked body 15a reduce warping of the stacked bodies 15a and 15b due to the cavities 87.

Figure 17:
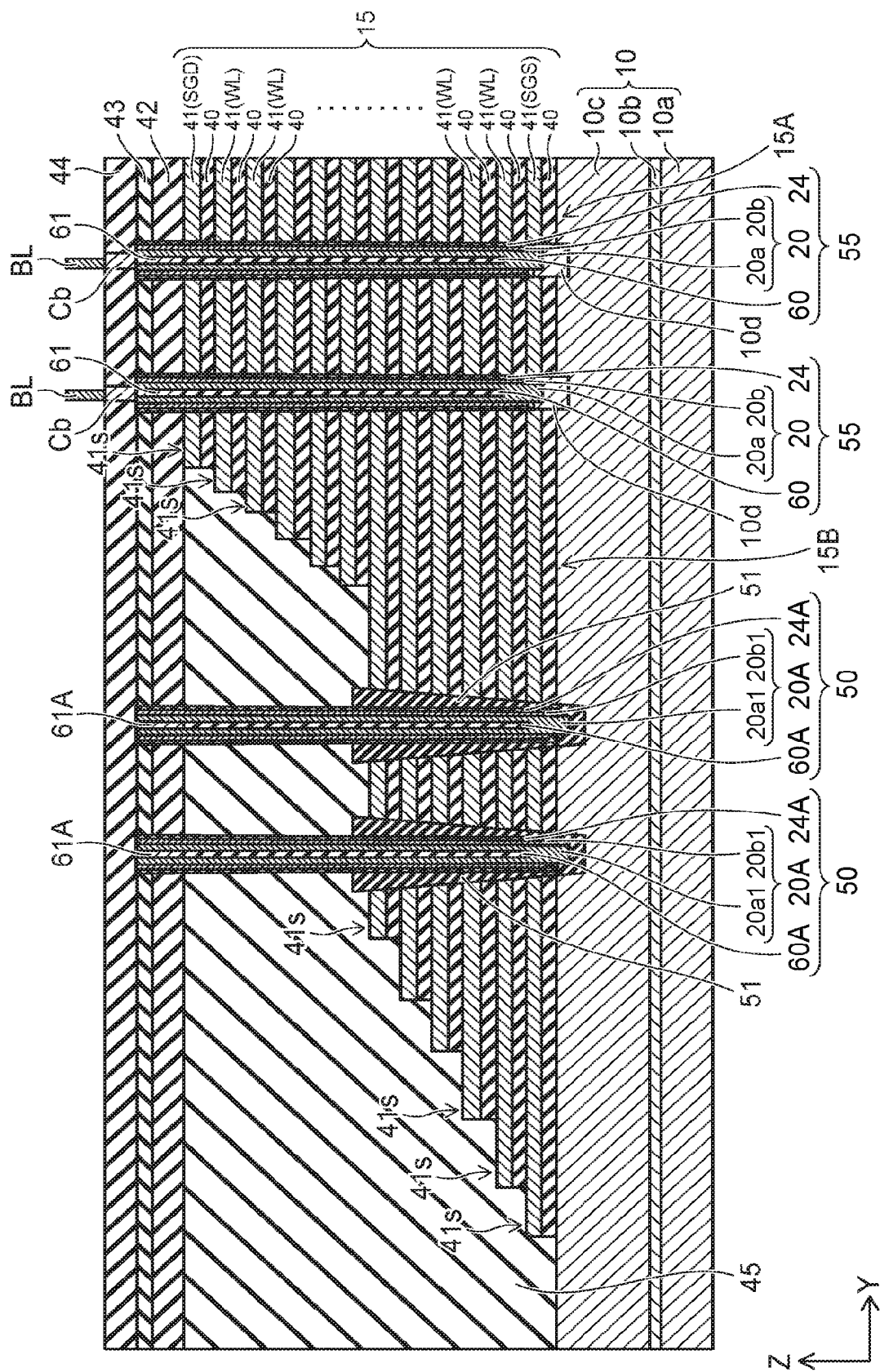

Thereafter, as shown in FIG. 17, a conductive material such as tungsten is deposited to fill the cavities 87. This forms the electrode layers 41 having the drain-side select gate SGD, the source-side select gate SGS, and the word lines WL. In this manner, the sacrifice layers 81 are replaced by the electrode layers 41, and the stacked body 15 is formed between the slits ST. The stacked body 15 has the central portion 15A with the columnar members 55, and the end portion 15B with the columnar members 50. The electrode layers 41 formed in the end portion 15B have a stepped shape, with the step 41s formed for each electrode layer 41.

Thereafter, silicon oxide is deposited on the inner surface of the slits ST to form an insulating film, and a metal such as tungsten is deposited to form the interconnect portion 18 (see FIG. 3). After forming the insulating layer 44 on the insulating layer 43, contact holes are formed through the insulating layer 44, and a metallic material such as tungsten is embedded in the contact holes to form the contact portions Cb. Thereafter, the bit lines BL to be connected to the contact portions Cb are formed.

Contact holes through the insulating layers 44, 43, 42, and 45 are formed, and a metallic material such as tungsten is embedded in the contact holes to form the contacts 30 (see FIG. 3). The contacts 30 are formed on the steps 41s.

This completes the semiconductor memory device 1 of the embodiment.

In the semiconductor memory device 1 of the embodiment, the insulating film 51 is provided that covers the bottom portion of the columnar members 50 of the stacked body 15. By the provision of the insulating film 51, the bottom surface of the columnar members 50 does not contact the semiconductor substrate 10, and the columnar members 50 can be electrically insulated from the semiconductor substrate 10. This suppresses the passage of a leak current from the contact 30 to the semiconductor substrate 10 via the columnar member (channel 20A) even when, for example, the columnar member 50 and the contact 30 contact, and conduct electricity as a result of a misalignment occurring in the contacts 30. Accordingly, the passage of a leak current to the columnar members 55 on the semiconductor substrate 10 can be suppressed. The semiconductor memory device 1 thus becomes less likely to fail in performing operations, for example, in memory operations such as a write operation.

A reliable semiconductor memory device can be achieved with the embodiment described above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
   a substrate;
   a stacked body provided on the substrate and including a plurality of electrode layers separately stacked each other;
   a columnar member provided in the stacked body and including a first semiconductor portion extending in a stacked direction of the plurality of electrode layers; and
   an insulating film covering a bottom portion of the columnar member;
   a portion of the insulating film being located between one of the plurality of electrode layers of the stacked body and the columnar member.

2. The device according to claim 1, wherein the insulating film contains silicon oxide.

3. The device according to claim 1, wherein the insulating film has a shape of a bottomed cylinder.

4. The device according to claim 1, wherein the insulating film has a thickness in a direction along an upper surface of the substrate, the thickness becoming smaller toward the lower layers of the stacked body.

5. The device according to claim 1, wherein
   the columnar member includes a multilayer film provided between the first semiconductor portion and the stacked body, and
   the portion of the insulating film is located between the one of the plurality of electrode layers of the stacked body and the multilayer film.

6. The device according to claim 1, further comprising a first insulating layer covering a portion of the stacked body, wherein the stacked body includes a stepped end portion with a step provided for each of the electrode layers,
   the first insulating layer covers the end portion of the stacked body,
   the columnar member extends in the end portion and in the first insulating layer in the stacked direction, and
   at least one portion of the insulating film is located in the end portion.

7. The device according to claim 6, wherein the portion of the insulating film is located in the first insulating layer.

8. The device according to claim 1, further comprising:
   a second semiconductor portion provided in the stacked body and extending in the stacked direction;
   a charge storage film provided between the second semiconductor portion and the stacked body; and
   a first interconnection provided on the stacked body and connected to the second semiconductor portion.

9. The device according to claim 1, further comprising:
   a peripheral circuit provided around the stacked body and including a switching element, and a second insulating layer provided on the switching element,
   wherein an upper surface of the insulating film is located on substantially a same plane as an upper surface of the second insulating layer.

10. A semiconductor memory device comprising:
    a substrate;
    a stacked body provided on the substrate and including a plurality of electrode layers separately stacked each other;
    a first semiconductor portion provided in the stacked body and extending in a stacked direction of the plurality of electrode layers;

a first charge storage film provided between the first semiconductor portion and the stacked body;

a second semiconductor portion provided in the stacked body, extending in the stacked direction, and containing a same material contained in the first semiconductor portion; and an insulating film covering a bottom surface and a side surface of the second semiconductor portion;

a portion of the insulating film being located between one of the plurality of electrode layers of the stacked body and the second semiconductor portion.

11. The device according to claim 10, wherein the insulating film contains silicon oxide.

12. The device according to claim 10, wherein the insulating film has a shape of a bottomed cylinder.

13. The device according to claim 10, wherein a portion of the insulating film is located in the substrate.

14. The device according to claim 10, wherein the insulating film has a thickness in a direction along an upper surface of the substrate, the thickness becoming smaller toward the lower layers of the stacked body.

15. The device according to claim 10, further comprising a second charge storage film provided between the second semiconductor portion and the stacked body and containing a same material contained in the first charge storage film.

16. The device according to claim 15, wherein the portion of the insulating film is located between the one of the plurality of electrode layers of the stacked body and the second charge storage film.

17. The device according to claim 16, wherein the insulating film between the stacked body and the second charge storage film has a thickness in a direction along an upper surface of the substrate, the thickness becoming smaller toward the lower layers of the stacked body.

18. The device according to claim 15, further comprising a first interconnection provided on the stacked body and connected to the first semiconductor portion, wherein the first semiconductor portion includes a first body, and a first cover layer provided between the first body and the first charge storage film, the second semiconductor portion includes a second body, and a second cover layer provided between the second body and the second charge storage film, and the insulating film covers a bottom surface of the second body.

19. The device according to claim 10, further comprising an insulating layer covering a portion of the stacked body, wherein the stacked body includes a stepped end portion with a step provided for each of the electrode layers, the insulating layer covers the end portion of the stacked body, the second semiconductor portion extends in the end portion and in the insulating layer in the stacked direction, and at least one portion of the insulating film is located in the end portion.

20. The device according to claim 19, wherein the portion of the insulating film is located in the insulating layer.

* * * * *